United States Patent
Haines

(10) Patent No.: US 8,907,769 B2
(45) Date of Patent: Dec. 9, 2014

(54) MAXIMALLY FLAT FREQUENCY CODED (MFFC) PASSIVE WIRELESS SAW RFID TAGS AND SENSORS

(71) Applicant: Mnemonics, Inc., Melbourne, FL (US)

(72) Inventor: Donald Mark Haines, Melbourne, FL (US)

(73) Assignee: Mnemonics Inc., Melbourne, FL (US)

( * ) Notice: Subject to any disclaimer, the term of this patent is extended or adjusted under 35 U.S.C. 154(b) by 128 days.

(21) Appl. No.: 13/653,391

(22) Filed: Oct. 16, 2012

(65) Prior Publication Data

US 2013/0278357 A1 Oct. 24, 2013

Related U.S. Application Data

(60) Provisional application No. 61/547,718, filed on Oct. 16, 2011.

(51) Int. Cl.
 *H04Q 5/22* (2006.01)
 *H03H 9/64* (2006.01)

(52) U.S. Cl.
 CPC *H03H 9/64* (2013.01); *H03H 9/642* (2013.01)
 USPC ........................................ 340/10.3

(58) Field of Classification Search
 USPC ............ 340/10.41, 10.31; 333/133, 193, 197; 310/313
 See application file for complete search history.

(56) References Cited

U.S. PATENT DOCUMENTS

| | | | |
|---|---|---|---|
| 4,035,675 A | 7/1977 | Malocha | |
| 4,200,849 A | 4/1980 | Malocha | |
| 4,369,390 A | 1/1983 | Malocha | |
| 4,746,830 A | 5/1988 | Holland | |
| 5,028,831 A | 7/1991 | Malocha | |
| 5,034,793 A | 7/1991 | Malocha | |
| 5,130,597 A * | 7/1992 | Mariani | ................... 310/313 D |
| 5,155,406 A | 10/1992 | Cho | |
| 7,105,980 B2 | 9/2006 | Abbott | |
| 7,213,314 B2 | 5/2007 | Abbott | |
| 7,434,989 B2 | 10/2008 | Solie | |
| 7,623,037 B1 | 11/2009 | Malocha | |
| 7,642,898 B1 | 1/2010 | Malocha | |
| 7,777,625 B1 | 8/2010 | Puccio | |
| 7,791,249 B2 | 9/2010 | Hines | |
| 7,825,805 B2 | 11/2010 | Malocha | |
| 7,952,482 B2 | 5/2011 | Malocha | |
| 7,961,105 B2 | 6/2011 | Puccio | |
| 8,169,320 B2 | 5/2012 | Malocha | |
| 2007/0296305 A1 * | 12/2007 | Hines et al. | ................ 310/313 B |
| 2010/0060429 A1 | 3/2010 | Hines | |
| 2010/0117804 A1 | 5/2010 | Malocha | |
| 2010/0271209 A1 | 10/2010 | Puccio | |
| 2011/0135026 A1 | 6/2011 | Malocha | |

* cited by examiner

*Primary Examiner* — Vernal Brown
(74) *Attorney, Agent, or Firm* — John L DeAngelis; Beusse Wolter Sanks & Maire

(57) ABSTRACT

A surface acoustic wave device responsive to an interrogation signal for producing a return signal. The surface acoustic wave device comprises an antenna for receiving the interrogation signal, a piezoelectric substrate, one or more frequency-selective reflective arrays disposed on the piezoelectric substrate, an interdigital transducer for launching an incident surface acoustic wave on the substrate in response to the interrogation signal, the incident surface acoustic wave propagating to the one or more frequency-selective reflective arrays, a reflected surface acoustic wave reflected from each one of the reflective arrays, the interdigital transducer receiving the reflected surface acoustic waves, and the return signal, responsive to each reflected surface acoustic waves.

11 Claims, 4 Drawing Sheets

US 8,907,769 B2

MAXIMALLY FLAT FREQUENCY CODED (MFFC) PASSIVE WIRELESS SAW RFID TAGS AND SENSORS

CROSS REFERENCE TO RELATED APPLICATIONS

This patent application claims the benefit of Provisional Patent Application assigned application No. 61/547,718 and filed on Oct. 16, 2011, which is incorporated herein by reference.

FIELD OF THE INVENTION

The present invention applies to passive wireless Surface Acoustic Wave (SAW) devices that are used in RFID (Radio Frequency Identification) tags or wireless sensor applications.

BACKGROUND OF THE INVENTION

A SAW device produces a delayed echo when interrogated by an RF pulse (i.e., an interrogating signal, or incident signal) from a radio frequency (RF) transmitter. The RF pulse is also referred to as a chip or RF chip. The echo response or echo signal is produced passively, that is, similar to a light-reflecting mirror. However, like a distorting carnival mirror, the echo signal carries a signature of the reflecting device as well as a signature of the incident signal. The echo signal is re-transmitted from the SAW device to an RF receiver without the aid of active components. At the RF receiver the echo signal is analyzed and identified.

The characteristics of the reflected signal that are imparted by the SAW device is the focal point of the present invention.

FIG. 1 depicts a prior art SAW device 10. An interrogating or illuminating wave comprises a radio frequency (RF) signal pulse 12 transmitted by an RF transceiver 14, which is referred to in this document as a "SAW interrogator." The transmitted signal travels through space to each SAW device within the field of view of the SAW interrogator. Only one SAW device 10 is illustrated in FIG. 1. The interrogating signal is received by an antenna 18 connected to an interdigital transducer (IDT) 20 disposed on a piezoelectric substrate 24. The IDT 20 launches an incident surface acoustic wave (SAW) 28 onto the piezoelectric substrate 24 in response to the received interrogation signal.

The SAW 28 propagates along the substrate 24 and is received at a reflector array 30 also disposed on the piezoelectric substrate 24. In applications where several SAW devices are within range of the RF transceiver each provides a reflected signal back to the RF transceiver. The reflector array 30 of each SAW device in a system of SAW devices (where the SAW device 10 is one SAW device within that system) comprises a unique pattern of metal electrodes 34 that impart a unique impulse response to the incident SAW 28. The impulse response of the reflector array 30 is imparted to the incident SAW 28 as it launches a reflected SAW 34 back to the IDT 20. The IDT 20 then converts the acoustic wave to an electrical signal that is radiated from the antenna 18 back to the RF transceiver 14 for extraction of the desired information in the reflected signal.

Let the mathematical function for the incident or interrogation SAW be defined as s(t), and a mathematical function for the impulse response function of the reflector array 30 be defined as h(t). Then the RF echo signal or the reflected SAW 34 signal, represented as y(t), received back at the IDT 20 and transmitted from the SAW device antenna 18 is computed as a conventional linear system output:

$$\text{Echo signal} = y(t) = s(t) * h(t)$$

(where * is the convolution operator, not multiplication)

The most basic application of such SAW devices is to simply identify (ID) an object to which the SAW device has been affixed. These devices are therefore often referred to as "tags" or "RFID tags." SAW devices are also employed to remotely sense changes in the substrate (and thus changes to the SAW device elements disposed on the substrate) such as changes in temperature and applied stresses. These applications are beyond the scope of the current patent application. To clarify, these SAW devices are not representative of the current large annual market in active RFID tags. The SAW devices for such applications have not yet been widely marketed.

Until recently the described wireless-passive SAW devices could only be detected within a few feet of the SAW interrogator, since the RF signal returned by the devices is so weak (i.e., signal losses in the SAW device are quite high). However, due to recent improvements in the SAW devices and in the SAW interrogator electronics, SAW devices can now be interrogated at distances over about 20 ft. The number of SAW sensors or SAW tags that can operate within the detection volume grows as a third power of the detection range. As the detection range increases the number of reflected signals or echoes (one from each SAW device) increases and interference between these return signals or echoes also increases. There is therefore a growing interest in avoiding mutual interference between SAW devices.

A similar device is described by William R. Holland in U.S. Pat. No. 4,746,830. But the present invention offers improvements to Holland's device by adding amplitude weighting and specifying the spacing, $\Delta f$, of center frequencies of the SAW reflectors, such that the echoes produced from multiple sensors cause minimal mutual interference.

BRIEF DESCRIPTION OF THE FIGURES

The foregoing and other features of this invention will be apparent from the following more particular description of the invention, as illustrated in the accompanying drawings, in which like reference characters refer to the same parts throughout the different figures.

DETAILED DESCRIPTION OF THE INVENTION

Figure 1:
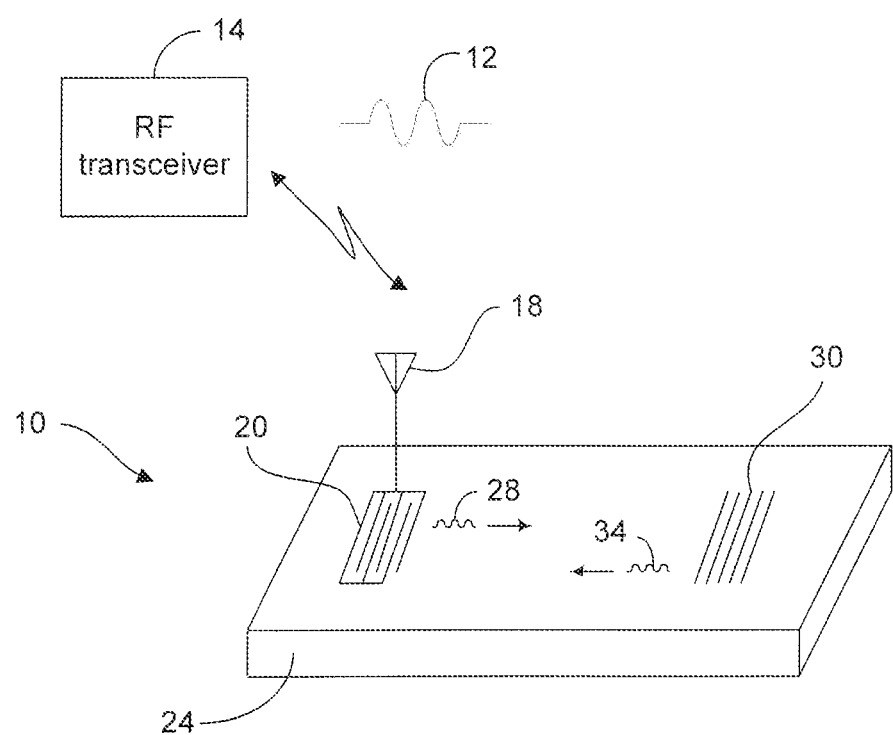
FIG. 1 illustrates a prior art SAW device.

Before describing in detail the particular methods and apparatuses related to maximally flat frequency coded passive wireless SAW devices, it should be observed that the present invention resides primarily in a novel and non-obvious combination of elements and process steps. So as not to obscure the disclosure with details that will be readily apparent to those skilled in the art, certain conventional elements and steps have been presented with lesser detail, while the drawings and the specification describe in greater detail other elements and steps pertinent to understanding the invention.

The following embodiments are not intended to define limits as to the structure or method of the invention, but only to provide exemplary constructions. The embodiments are permissive rather than mandatory and illustrative rather than exhaustive.

The present invention relates to a method and a device for implementing the method such that a system of SAW devices (i.e., a plurality of SAW devices all responding to the same interrogation signal) present a set of spread-spectrum codes that minimize mutual interference between passive-wireless SAW devices operating within range of the same SAW interrogator. By specifying the impulse response of each device, the apparatus and method in fact specify the features of the devices. Therefore the invention applies to any SAW device or a system of such SAW devices that are used as RFID tags or sensors. Any number of code chips may be specified. Each code chip consists of a single RF pulse shaped by a window function. Each code chip has the same amplitude and shape, and each has a constant frequency (i.e., the spacing of the reflector elements within one code chip determines the frequency of the reflection from that code chip) over a duration of the pulse. The frequency differs from chip to chip by a constant value, M. Each chip can be used once (or n times) in a code sequence in any order and with any spacing between each chip (i.e., between each reflective array). M is chosen so the individual chip spectra cross over at about their half power points, which creates a maximally flat power spectrum when all chips are combined. Optimum code sequences are presented that avoid mutual interference between SAW devices regardless of the number of chips used.

The principal benefits of the invention are:
1. Minimum leakage from the spectrum of one frequency chip into other chips. This results in an improved ability to overlap echo signals without mutual interference.
2. Minimum ripple (i.e., maximum flatness) in the frequency response of the SAW devices, providing optimum measurement data (e.g., for sensor applications) due to consistent signal energy over the entire operating frequency range.

The present invention describes an apparatus and a method for a set of RFID tags (or RF sensors) that can operate in close proximity to each other with a minimum of mutual-interference between the SAW devices of the code set. For purposes of this description, "mutual-interference" at the RF interrogator is defined as contamination of the echo from one device by echoes from one or more other devices. It is known that this interference also causes some functional degradation of the system, i.e., the interpretation of the received signal at the interrogator.

The mathematical function produced by SAW devices of the present invention is directly etched onto each SAW device by the patterns of the reflector arrays (wherein each array comprises a plurality of reflecting electrodes). That is, the time delays are "encoded" as distances from the IDT to each reflector array, frequencies of the frequency selective reflective arrays are set by electrode spacing within each reflector array, and amplitude weighting is achieved by varying the electrode lengths (or aperture).

Figure 2:
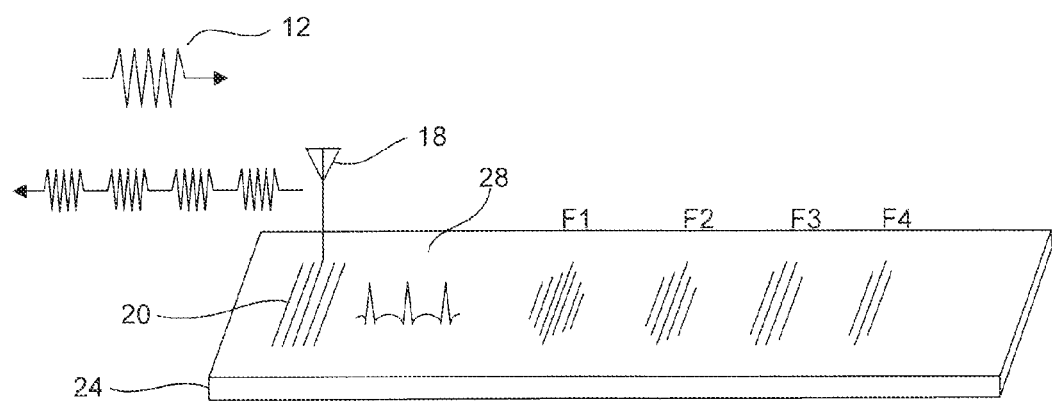
FIG. 2 illustrates a SAW device constructed according to the teachings of the present invention.

FIG. 2 illustrates certain aspect of a SAW device 40 according to the teachings of the present invention. The IDT transducer 20 creates the SAW 28 in the substrate 24. The SAW 28 is reflected from each one of four reflector arrays referred to as F1, F2, F3, and F4, where the Fx values refer to the frequency of the echo or reflected SAW returned from the respective reflector array. As can be seen, each of the reflector arrays F1, F2, F3, and F4 are spaced a different distance from the IDT transducer 20, resulting in a time delay between each of the reflected SAW signals. Further, each of the reflecting electrodes of each reflector array F1, F2, F3 and F4 are spaced a different distance apart, resulting in different reflecting frequencies. Also, the reflecting electrodes in each reflecting array have a different length to create an amplitude weighting of the reflected or echo signal.

The scope of this patent application claims rights to both the design specification methodology and to the SAW devices resulting from it.

By specifying placement and dimensions of the reflecting electrodes that make up each frequency-selective reflective array, a SAW device of the present invention can be designed to select certain frequency components from the interrogation signal and impose different time delays and amplitude weights to each of those selected frequency components. Time delays of several microseconds are typical.

The coding scheme of the present invention applies frequency selection, amplitude weighting and time delays that result in hundreds of possible unique combinations (i.e., hundreds of uniquely coded SAW devices). The combination of these parameters defines an impulse response, which is a unique characteristic that makes each SAW device identifiable from the others. Preferably, one carefully selects optimum subsets from this group of all possible combinations to minimize mutual interference between device echoes.

Direct-sequence spread-spectrum transmissions multiply (i.e. modulate) the data being transmitted (i.e., the information bits) by a "noise" signal. The noise signal is in fact a pseudorandom sequence of bits having a 1 or a −1 value (each referred to as a chip). The frequency of this pseudorandom sequence of bits is much higher than the frequency of the data signal. The resulting signal is a phase modulated version of the information bits.

As applied to a SAW device the "noise signal" or "spreading signal" is unique to each device, and is the total impulse response function, $h_i(t)$, of that device or more generally characteristic, of the "$i^{th}$" device. The total impulse response function is based on the placement and physical attributes of the individual reflector arrays. In a SAW sensor application, information derived from the return signal is the modification (or modulation) of the response signal caused by changes in the SAW substrate that result from temperature changes, strain/compression changes, or from delay changes caused by detector films applied to the surface of the substrate. Therefore the basic $h_i(t)$ function (without modulation caused by temperature, stresses, etc.) for each SAW device must be known a priori by the RF transceiver system that decodes the received signals in order to be able to extract this modulation effect (e.g., temperature, stress) on the basic signal.

In a spread-spectrum signal, each chip has a much higher bandwidth (i.e. shorter duration) than the actual information being conveyed. For the sensor application, the higher bit rate of the spread-spectrum signal increases the time of arrival resolution, which is the important parameter extracted from the received signal since one objective is to detect changes in the propagation delay of the SAW signal on the substrate of the SAW device. Therefore the higher the bandwidth of the impulse response functions $h_i(t)$, the higher the resolution of the sensor reading.

The code chip sets differ from each other in frequency, phase, amplitude, time delay or any combination of these parameters. The waveform functions described in the present patent application specify signals that would be produced by the SAW devices when excited by a very short voltage impulse; specifically, a unit impulse. That is, a specified set of MFFC (maximally flat frequency coded) waveforms is represented by impulse response functions, $h_i(t)$, that are built into each device in a set of SAW devices. The composite effect of the many reflector arrays of one SAW device determines the unique $h_i(t)$ for that device.

The interrogation pulse transmitted by the RF transceiver need not be an MFFC waveform, although that is a good choice.

The MFFC codes are constructed from a set of M (any integer number) code chips, wherein each code chip consists of a short RF pulse that may be amplitude-weighted (i.e. shaped or tapered). The composite effect defines the function $h_i(t)$. The RF frequency of the chip is constant for the duration of the chip. But the frequency changes by a constant frequency increment, $\Delta f$, for each successive chip in the set. Therefore the code chips of successively higher frequencies can be named "F1", "F2", "F3", etc. Selection of the parameter $\Delta f$ will be discussed later. Since these code chips are mainly characterized by their center frequency they will be referred to as frequency chips. In addition to the center frequency, the frequency chips are also characterized by their position in time ($\tau$), which must be different for each chip since the reflector arrays are spaced apart in space/distance. However, the reflected pulse width (T), and the peak pulse amplitude and shape, as determined by the selected window function, is the same for every chip in one chip set. Each successive frequency chip may start with any RF phase but these phases must be precisely specified.

The maximum number of SAW devices that can operate in a non-interfering network or environment depends on the bandwidth available and the feasible physical length (which determines the number of chips in a chip set) of the SAW device. Each additional device added to the network requires at least two chip intervals (2T), with a shorter T requiring more bandwidth. Additional chips in one chip set provide more signal processing gain and require more bandwidth, but have little effect on the maximum number of SAW devices. However, a greater number of different chips allow for a larger number of unique chip sets, which is similar to the ability to form more 5-letter words from a 26 character alphabet than from a 13 character alphabet.

The amplitude weighting of each chip in a chip set by a window function is one feature of the MFFC frequency chips, since the resulting shape reduces interference between chips. Any window function can be used to create the shape of the pulse, including a rectangular window, but some window functions may provide a flatter spectral response, which is one desirable feature of the present invention.

An MFFC impulse response function is created by placing the frequency chips into a sequence. Frequency chips may be placed with no gap between successive chips or with any arbitrary (but precisely specified) spacing between chips and the chips can be placed in any order. All chips in a code set (or chip set) may be used an equal number of times, preferably once.

In one application a particular MFFC code is named according to the order of the frequency of each chip in the chip set. For instance a sequence referred to as an "F1-F2-F3-F4" sequence is implemented by the SAW device 40 of FIG. 2. The impulse response of the SAW device 40 is illustrated in a top trace of FIG. 3. This embodiment illustrated in the top trace of FIG. 3 uses 100 nsec pulse widths.

Preferably the interrogation signal should have a frequency content that covers the entire frequency spectrum of the sensor device, with a sequence of six frequency chips, no timing gap between frequency chips, and the chips shaped by a root-Hamming window function.

The waveform transmitted by the SAW interrogator, i.e., the interrogation RF pulse 12 in both FIGS. 1 and 2 need not consist of MFFC frequency chips. The MFFC technique applies to the design of the impulse response to be fabricated into the SAW devices by appropriate placement of the reflecting arrays and the placement and length of the reflecting electrodes in each reflecting array. Many signals other than MFFC pulses can be successfully used to interrogate the SAW devices, so the design of the transmitter signal or specification of the interrogation pulse is not discussed in the present patent application. However, transmitting the frequency chip sequence depicted in FIG. 3 or that same sequence in reverse order is certainly covered by the scope of the present patent application.

A maximally flat frequency response is preferred to detect changes (e.g., changes due to stress or temperature changes) equally well at any point in the response frequency spectrum, since the physical location of such changes may occur at any point on the substrate and thus at any frequency of the frequency response.

The major characteristic of the MFFC frequency chips is that, except for adjacent frequencies (e.g. F2 and F4 are adjacent to chip F3), the frequency chips, as embodied in the etched electrodes on the device, do not reflect a significant portion of the spectral power associated with the other frequency chips, thereby reducing the interference. However, applying a window function to the amplitude response of the frequency chips actually increases the leakage of spectral energy into the frequency band of the next adjacent chip. However leakage into frequency chips beyond the adjacent ones is greatly attenuated.

Figure 3:
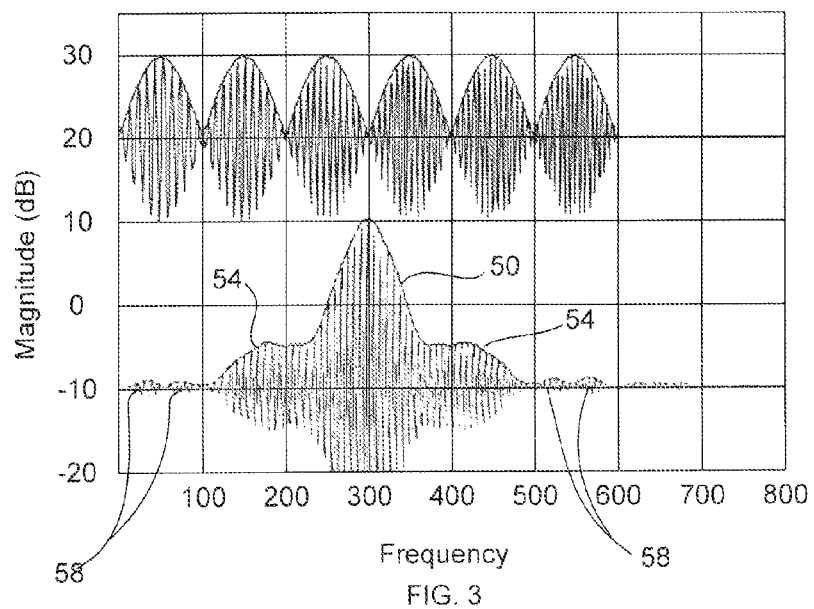
FIG. 3 illustrates waveforms associated with the SAW device of FIG. 2.

This property is illustrated in the lower trace of FIG. 3 that shows the echo signal or reflected signal when a six-chip (F1-F2-F3-F4-F5-F6) device is interrogated by a single pulse at the center frequency (in MHz) of the F3 chip. The SAW device produces a full response echo from the metallization electrodes associated with frequency chip F3 (indicated generally by reference character 50), and there is also a significant response from metallization arrays associated with chips F2 and F4 (indicated generally by reference character 54). However, all other responses (indicated generally by reference character 58) are low enough in amplitude to be considered inconsequential.

The envelope of the code chips in FIG. 3 is defined by a root-Hamming window function, which is shown as an outline along the top of the impulse response signal (top trace).

The code chips can be arranged in any order and all such orders will provide the same magnitude response spectrum. Differences between the order of the code chips is reflected in the phase response.

Figure 4:
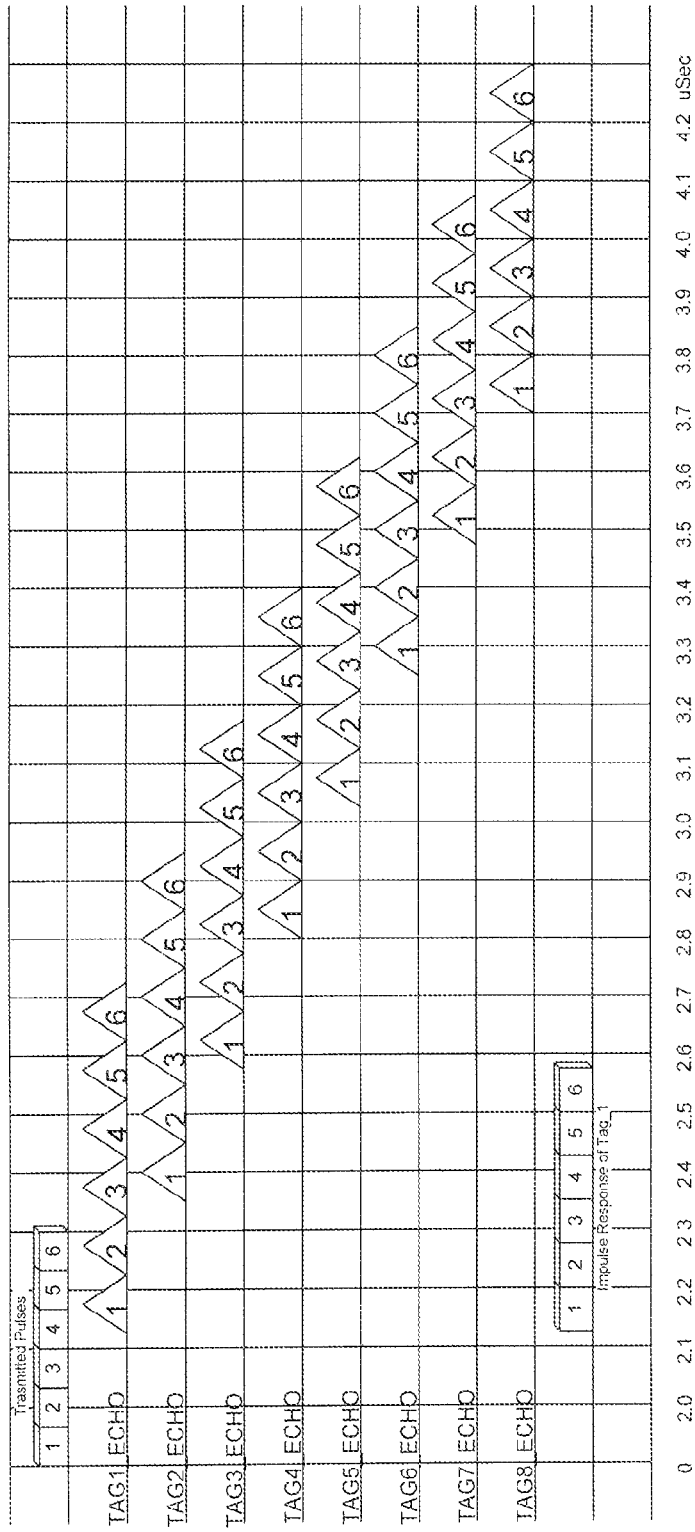
FIG. 4 illustrates a six chip code for minimal cross-interference between eight SAW device RFID tags.

Mutual interference can be minimized by choosing a sequence of code chips such that no two SAW tag devices produce an echo signal of the same or adjacent frequency at about the same time, specifically, within the same code chip interval T. FIG. 4 (illustrating the six-chip MFFC code set for minimal cross-interference between eight SAW RFID tags) shows one embodiment that guarantees minimal interference from one SAW device to any other. The top row shows a sequence of transmitted frequency chips (rectangular RF pulses). The transmitted signal is convolved with the impulse response of tag 1 and a tag 1 echo is illustrated in the second row. The echo response of tag 1 has a chip duration T. Each successive tag echo is also illustrated and each has the same impulse response as the previous echo, but delayed by about a little more than the duration of two code chips (2T).

In FIG. 4, both the transmitted sequence and the impulse response sequence are F1-F2-F3-F4-F5-F6. The 50 nsec pulse width deviates from previous examples but as long as the Δf is adjusted accordingly, it is a valid representation of an MFFC waveform (Δf must vary inversely with T).

The output of this convolution represents the signal echoes; the second row shows the tag 1 echo, the third row shows the tag 2 echo, and so on. FIG. 4 shows that about a 2-chip delay guarantees that echoes arriving simultaneously at the receiver will never be at the same or at an adjacent chip frequency. This advantage can be seen by simply noting that along any vertical line (which represents a single instant in time) none of the received chips have the same frequency. The additional delay (i.e. greater than 2 chip intervals) avoids frequency overlapping when the temperature difference between SAW devices becomes large.

Figure 5:
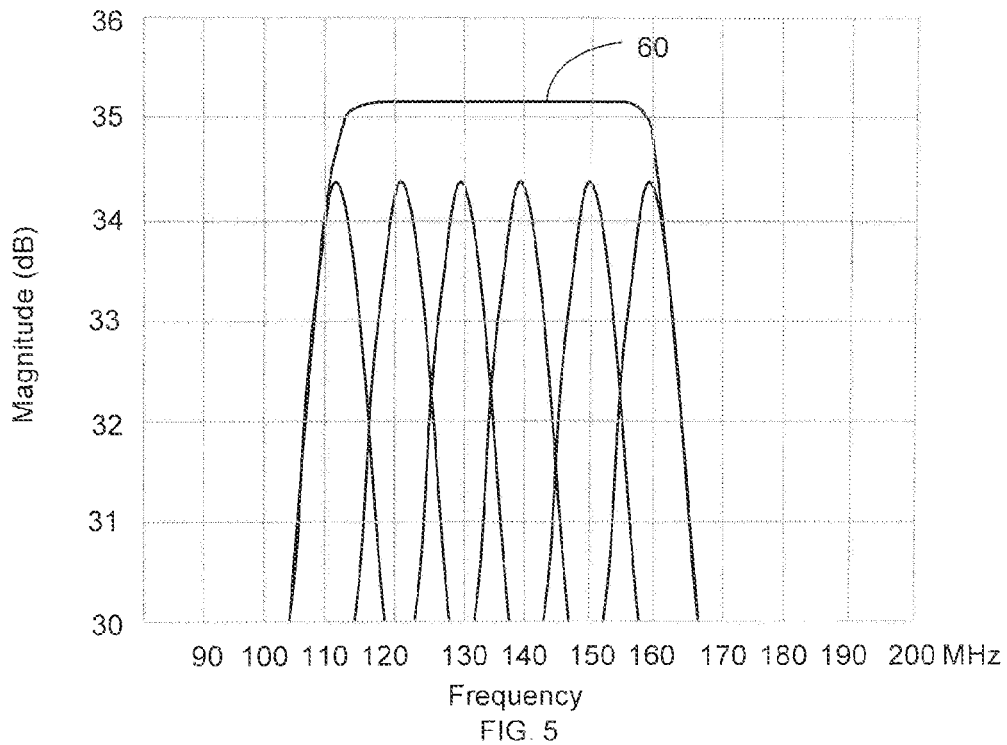
FIG. 5 illustrates six chip reflections, and their sum when a root-Gaussian windowing function is applied to the amplitude of the reflected signals.

The frequency spacing, Δf, is selected to minimize the amplitude ripple in the power spectrum of the combined signal including all frequency chips. The sum spectrum is shown by trace 60 in FIG. 5. The vertical axis is the response in dB and the horizontal axis is linear in frequency with units of MHz. The frequency spectrum of an RF pulse, and therefore an MFFC frequency chip, shows a main frequency lobe located at the frequency of the sinusoid inside the pulse window. The width of the main lobe depends inversely on the pulse width (T), and on the shape of the window function, w(t). FIG. 5 shows the spectra for six frequency chips using a root-Gaussian window function. In the illustrated exemplary embodiment, each frequency chip is about 100 nsec wide and spaced by about 9.66 MHz. The 9.66 MHz Δf parameter minimizes the amplitude ripple in the combined power spectrum. For other window functions it may be necessary to use a different optimum value of Δf.

The six spectra sum smoothly because at the optimum value of Δf the individual chip spectra overlap at (or near) their half power points. This means that when the power spectra are summed they will have the same power level at the crossover points as they do at the spectral peaks, while the flatness between these points is determined by the shape of the selected window function. Note that the optimum crossover point is not exactly −3 dBc (power ratio of the pulse power to the carrier power) since leakage power from the other chips also contributes to the power sum. Either choice (i.e. the exact −3 dBc point or the maximally-flat point) is acceptable, since exact flatness is only useful in some applications.

Figure 6:
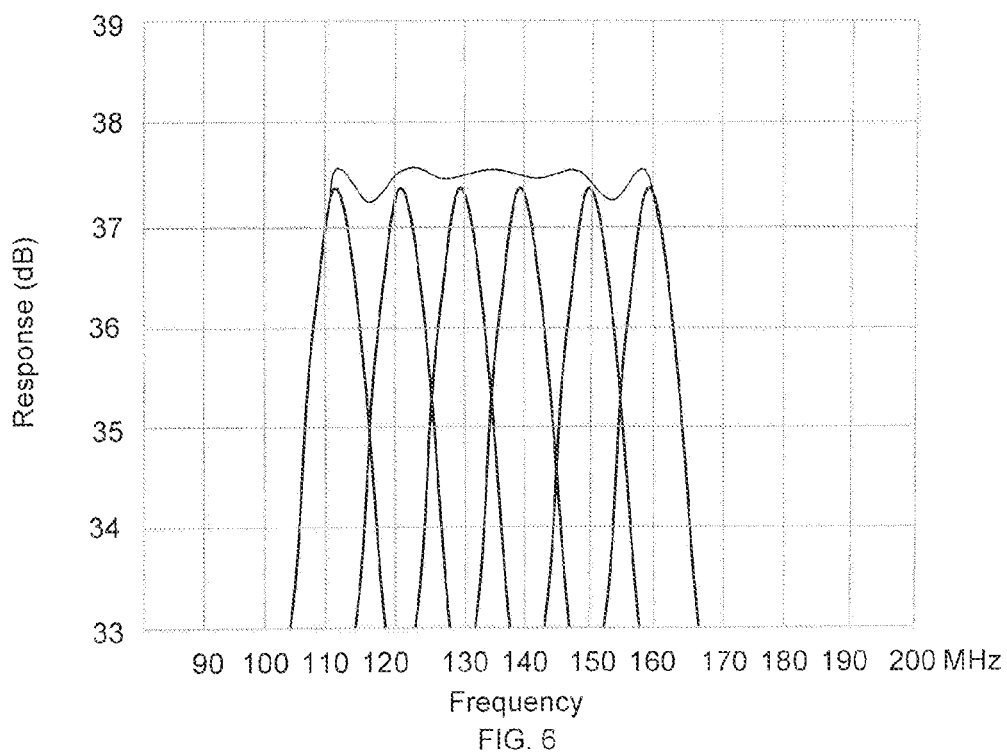
FIG. 6 illustrates six chip reflections, and their sum when a rectangular windowing function is applied to the amplitude of the reflected signals.

To see the effect of the window function, compare the combined spectrum in FIG. 5 to one for a set of rectangular-windowed frequency chips shown in FIG. 6. Even though the Δf of 9.45 MHz was optimum to minimize ripple in the combined power spectrum, significant ripple remains in the FIG. 6 embodiment. It was also noted that an orthogonal spacing of 10 MHz (which is 1/T for the 100 nsec pulses) is even less smooth. The 9.45 MHz value for Δf is what makes this set of frequency codes create a MFFC.

Six frequency chips placed in sequential order and tapered by a Hamming or Gaussian window function, are not the only combination of parameters that functions according to the teachings of the present invention. As mentioned above, frequency chips can be added without increasing mutual interference levels, and many different window functions will produce a nearly flat spectral response. If rather than limiting a network to the ascending or descending order of chips used in FIG. 4, a random code of six chips provides 720 codes and with 10 time delays, a network with 7200 unique devices could be defined.

Search algorithms can be easily devised to select sets from these 7200 codes with acceptable levels of device-to-device interference, and depending on what levels are acceptable for various applications, many more than 8-10 devices could co-exist. Also, the leakage into adjacent code chips is known, so successive codes may not need to be spaced by 2T. Again, the level of mutual interference depends on the application.

While the present invention has been described with reference to preferred embodiments, it will be understood by those skilled in the art that various changes may be made and functionally equivalent elements may be substituted for the described elements without departing from the scope of the invention. The scope of the present invention further includes any combination of elements from the various embodiments set forth. In addition, modifications may be made to adapt a particular situation to the teachings of the present invention without departing from its essential scope. Therefore, it is intended that the invention not be limited to the particular embodiments disclosed, but that the invention will include all embodiments falling within the scope of the appended claims.

What is claimed is:

1. A surface acoustic wave device responsive to an interrogation signal for producing a return signal, the surface acoustic wave device comprising:
   an antenna for receiving the interrogation signal;
   a piezoelectric substrate;
   one or more frequency-selective reflective arrays disposed on the piezoelectric substrate;
   an interdigital transducer for launching an incident surface acoustic wave on the substrate in response to the interrogation signal, the incident surface acoustic wave propagating to the one or more frequency-selective reflective arrays;
   a reflected surface acoustic wave reflected from each one of the reflective arrays;
   the interdigital transducer receiving the reflected surface acoustic waves;
   the return signal, responsive to each reflected surface acoustic waves;
   wherein a frequency difference Δf between a frequency of the reflected surface acoustic wave reflected from a first frequency-selective reflective array and the reflected surface acoustic wave reflected from a second reflective array is selected to minimize amplitude ripple in a power spectrum of the return signal;
   wherein the frequency difference Δf is selected such that the power spectra of the reflected surface acoustic wave from each of the frequency-selective reflective arrays overlap at a frequency at about a half power value.

2. The surface acoustic wave device of claim 1 wherein the return signal exhibits a maximally flat magnitude as a function of frequency.

3. The surface acoustic wave device of claim 1 wherein each of the frequency selective reflective arrays is amplitude weighted with a predetermined window function that modifies the amplitude of the incident surface acoustic wave such that an impulse response of each frequency-selective reflective arrays is an amplitude weighted RF pulse and the window function defines the shape of a pulse envelope.

4. The surface acoustic wave device of claim 1 wherein each of the frequency selective reflective arrays comprises a plurality of reflector elements, and wherein a spacing between each one of the plurality of reflector elements determines a frequency of the reflected surface acoustic wave from each of the reflective arrays.

5. The surface acoustic wave device of claim 1 wherein a peak frequency response of each frequency-selective reflective array is spaced by a frequency difference that causes a response spectrum of each reflective array to intersect the response spectrum of a next reflective array at about a half power point of both spectra, such that the combined power spectrum of all the reflective arrays is maximally flat.

6. The surface acoustic wave device of claim 1 wherein a power spectrum associated with each successive frequency chip in a set of maximally flat frequency coded code chips, and therefore the power spectrum of the reflective array of the SAW device, intersects the power spectrum of the next higher array at about a −3 dBc point of each chip's spectrum.

7. The surface acoustic wave device of claim 1 wherein each frequency-selective reflective array has a center frequency and the reflective arrays are disposed on the substrate in order of lowest to highest center frequency or from highest to lowest center frequency.

8. The surface acoustic wave device of claim 1 wherein a time delay gap between each successive frequency selective reflective array is selective.

9. The surface acoustic wave device of claim 8 wherein a time delay gap between each successive frequency selective reflective array is about zero.

10. The surface acoustic wave device of claim 1 wherein each of the frequency selective reflective arrays comprises a plurality of reflector elements, and wherein a spacing between each one of the plurality of reflector elements determines a frequency of the reflected surface acoustic wave from each of the reflective arrays and wherein each one of the frequency selective reflective arrays exhibits a different frequency of the reflected surface acoustic wave.

11. The surface acoustic wave device of claim 1 wherein each one of the one or more frequency-selective reflective arrays provides a reflected signal such that a composite signal responsive to each of the reflected signals exhibits one or more of a desired frequency, phase, time delay and amplitude.

* * * * *